United States Patent [19]

Stoll et al.

[11] Patent Number: 5,000,226

[45] Date of Patent: Mar. 19, 1991

[54] CIRCUIT ASSEMBLY

[76] Inventors: Kurt Stoll, Lenzhalde 72, 7300 Esslingen, Fed. Rep. of Germany; Hans-Heinrich Glättli, Seestrasse 252, CH-8700 Zürich, Switzerland

[21] Appl. No.: 16,998

[22] Filed: Feb. 19, 1987

Related U.S. Application Data

[63] Continuation of Ser. No. 767,145, Aug. 19, 1985.

[30] Foreign Application Priority Data

Aug. 24, 1984 [DE] Fed. Rep. of Germany ....... 3431163

[51] Int. Cl.[5] ............................................ H05K 7/20

[52] U.S. Cl. .................................. 137/884; 361/395; 312/320

[58] Field of Search ....................... 137/343, 884, 377; 312/320.05; 361/39.505

[56] References Cited

U.S. PATENT DOCUMENTS

| | | | |
|---|---|---|---|
| 2,905,484 | 9/1959 | Crotty et al. | 137/343 |
| 3,264,526 | 8/1966 | Wiggermay | 361/395 X |
| 4,095,864 | 6/1978 | Hardin | 137/884 X |
| 4,306,587 | 12/1981 | Tchebinyayeff | 137/884 X |
| 4,399,487 | 8/1983 | Neumann | 361/395 X |
| 4,469,128 | 9/1984 | Petrimaux et al. | 137/884 X |
| 4,503,484 | 3/1985 | Moxon | 361/395 |
| 4,507,707 | 3/1985 | Willis | 137/884 X |
| 4,512,362 | 4/1985 | Groeschner | 137/884 X |
| 4,542,437 | 9/1985 | Ellis et al. | 361/395 X |
| 4,549,248 | 10/1985 | Stoll | 137/884 X |

*Primary Examiner*—John C. Fox
*Attorney, Agent, or Firm*—McGlew & Tuttle

[57] ABSTRACT

The invention relates to a circuit assembly comprising a block-shaped mount adapted to be equipped with aligned rows of electromagnetically operated fluid power valve-like components, said assembly having internal connection ducts, which on the one hand communicate with the components and the on the other with ducts of a manifold mounted on one of the two end faces of the mount. The block-shaped mount is adapted to be fitted with components on two opposite side faces and there is an electronic circuit board running generally parallel to the direction of the rows of components at a right angle to the side faces of the mount fitted with the components. For making a direct electrical connection between the electronic circuit board and the components gripping terminals are placed on the surface of the electronic circuit board facing towards the block-shaped mount for cooperation with the contact plugs on the components.

18 Claims, 3 Drawing Sheets

CIRCUIT ASSEMBLY

This application is a continuation, of application Ser. No. 767,145, filed Aug. 19, 1985, now abandoned.

BACKGROUND OF THE INVENTION

The invention relates to a circuit assembly comprising a block-shaped component mount adapted to be equipped with aligned rows of electromagnetically operated fluid power valve-like components, said assembly having internal connection ducts, which on the one hand communicate with the components and on the other with ducts of an elongated manifold mounted on one of the two ends of the block-shaped component mount, said manifold comprising at least one feed duct for the supply of a fluid under pressure to the components and at least two load ducts for the supply of loads, and an electronic circuit board for electrically driving the components.

Such circuit assemblies are employed in electrical-pneumatic controllers, the block-shaped component mount being equipped with components as for example electromagnetically driven valves, on one of its sides. The components are placed in two rows and receive electrical signals from a common edge connector, which runs parallel the components on the component mount. On the side opposite to the side with the components of the block-shaped component mount there is an electronic circuit board, which is fed with the control signals for the separate components and transmits the control or driving pulses via a harness of wires to the edge connector. Such an arrangement suffers from the disadvantage that it takes up a large amount of space, since because of the edge connector mounted on the block-shaped component mount it necessarily has a certain overall size. Furthermore manufacture is quite a complex process, since the edge connector has an elaborate structure and the internal wiring involves elaborate and high-cost operations for its production. A further drawback is caused by the wire harness as a connection between the electronic circuit board and the edge connector, since extensive soldering operations are necessary and it is quite possible for the connections to be confused. Furthermore a wire harness is cumbersome and is likely to be the cause of some of the wires being torn off their terminals. In the event of a defect occurring in the electronic circuit board it will will have to be replaced and it is then necessary for the entire wire harness to be unsoldered in order to make it possible for the electronic circuit board to be removed. There is then the disadvantage of a considerable loss of time and heavy costs.

SUMMARY OF THE INVENTION

One object of the invention is to remedy these shortcomings and to devise a circuit assembly which is compact in its structure and may be manufactured at a low cost. Furthermore it is to need only a small amount of space and is to be easily repaired. It is to be designed so as to make it very simple for the separate components and of the electronic circuit board to be replaced.

In order to achieve this or further aims that will become apparent, the invention is characterized in that the component mount is adapted to be equipped with components on two opposite side faces, in that the electronic circuit board is arranged generally parallel to the rows of components and at a right angle to the side faces that are adapted to be equipped therewith and in that for making a direct electrical connection between the electronic circuit board and the components female contacts are placed on the surface of the electronic circuit board facing towards the component mount for cooperation with the contact plugs on the components.

The result is then that the components are directly connected via a plug connection with the supply of signals from the electronic circuit board. Each component has certain female contacts associated therewith so that even on replacement of the electronic circuit board it will not be possible for the connections to be confused. The electrical part of the circuit assembly is clearly separated from the pneumatic part so that economic manufacture is made possible, since the female contacts may be directly applied to the electronic circuit board during the course of its manufacture. It is not necessary for there to be further electronic components on the electronic circuit board. Since the electronic circuit board is aligned generally normally to the side faces equipped with the components, on mounting or removing a component the electrical connection is automatically produced and interrupted. This plug connection vouches for easy repairs to the circuit assembly. The invention is very compact and the overall size is mainly determined by the mount and the components carried by it. The space requirement of the electrical power supply may be made to match it, seeing that the electronic circuit board may be made with very small dimensions. A further advantage of the invention is that the component mount is equipped with the components on two sides of it, this making possible manufacture of the component mount without electrical components.

Advantageous further developments of the invention are specified in the claims.

The components may be placed on two rows of seats therefor running parallel to the length of the mount to simplify production of the circuit assembly while at the same time making possible an optimum connection of the individual components with the electronic circuitry and with the pneumatic system.

The component seats may be placed opposite each other in pairs on the two sides of the mount in order to enable there to be a symmetrical form of the circuit assembly, something entailing economic manufacture.

The components may be placed at right angles to the side faces and extending in opposite directions therefrom to simplify mounting and the replacement of separate components.

The use of fastening elements such as screws is advantageous inasfar as the components are then very firmly attached to the component mount.

The contact plugs on the components preferably point towards the circuit board to ensure that there is a very small distance between the separate contact plugs and the electronic circuit board with the outcome that the electrical connection may be produced extremely simply; furthermore the contact plugs may be parallel to the component seats to ensure a secure connection between the contact plugs and the female contacts.

To simplify the production of the electronic circuit board, the gripping female contacts project from the circuit board at 90°, since the gripping contacts may then be more simply set and soldered on the board.

If the female contacts are aligned parallel to the mount, there is the advantage that the separate components may be mounted on each of the surfaces adapted to have components mounted thereon and in this respect reliably receive the electrical signals. The female contacts may have two gripping lips closed by a spring to receive the contact plugs to simultaneously ensure both a secure connection between the female contacts and the contact plugs in the assembled condition of the individual components while on the other hand making it possible for the components to be readily replaced. It is possible to insert the contact plugs into the female contacts without complex soldering operations. The female contacts may be directly soldered or otherwise connected with electrical supply leads so as to make it possible to dispense with complex wiring, as for example using a wire harness, and there is a reduction not only in the amount of space needed but also in the outlay for the manufacturing operation.

If the supply leads are in the form of printed wiring, this will make possible economic manufacture, since the soldering operations are reduced to a minimum. Projecting wires, which are extravagant in the use of space and tend to be easily detached, become superfluous as a further useful development.

The board-mounted female contacts may be connected with a common multipole plug for connection of the circuit board with signal input leads to make possible very simple connection of the individual female contacts with an external signal supply. Furthermore, the replacement of the electronic circuit board is simplified, since by unjoining the plug connection on the multiple plug all signal leads are disconnected at once and may be reconnected at any time with exactly the same configuration. To make the fluid power and electrical connections readily accessible, the multipole plug may be located on the side of the circuit board facing away from the mount and adjacent the manifold. This measure is more especially of value, if the circuit assembly is used as a slide-in unit, since on insertion or retraction of the circuit assembly from an enclosure therefor the signal connections are automatically remade and broken.

Screws or the like may be used for attaching the circuit board to the manifold and/or the mount and this means that the electronic circuit board is securely and simply held in place.

The feed duct may communicate on the one hand with a feed connection duct in the mount and on the other may open on the end facing away from the manifold, the load ducts communicating with the load connection ducts in the mount and opening on the same end face of the manifold. This will make certain of a reliable connection between the feed duct and the load ducts respectively and the surfaces of the components used for mounting.

The outlet ports of the feed duct and of the loads may be placed on the side face aligned with the length of the manifold to more conveniently make possible the connection of a further component to the circuit assembly. The arrangement of the outlet ports in an aligned manner furthermore simplifies manufacture.

The fluid-wise connection of the manifold to external pipes joined to loads may be via a sealing bar made of rubber or the like and having male connectors projecting in pairs from its respective opposite sides and fitting into the manifold and the pipes as a simple way of connection with fluid power components. The connectors may be simply inserted into the outlet ports and held fast therein with an automatic sealing action. For this purpose it is an advantage that the sealing connectors are placed together in rows to form a sealing bar, as a further substantial improvement in assembly. It is however also possible to have a separate sealing connection for each outlet port. If the connectors are surrounded at their free ends with by sealing bead placed around their outer surfaces, there is an even better and more reliable sealing seat in the outlet ports.

A design in which the row of male connectors of the manifold and contacts of the multipole plug extend in the same direction is of particular advantage in the case of a "slide-in". All the connections are placed on one side and are thus readily accessible. The front part opposite to the end side of the mount may be terminated by a front panel roughly at 90° to the length of the mount and parallel to the manifold. The panel may have openings for switches for operating the components manually, and for lights to indicate component operation. These measures enable a simple check to be made on the functions of the individual components, as for example in the event of there being a defect. Furthermore, for special purposes, certain components may be operated separately. The lights make it possible for the order of excitation, for example, of the individual components to be checked out separately so that the entire circuit assembly may be readily monitored with respect to correct functioning. The provision of a handle on the panel facilitates the replacement of the circuit assembly.

In accordance with a further development of the invention the panel is detachably fixed in place with the use of distance pieces on a holding plate plane parallel thereto and with a second circuit board between them arranged in parallelism to process and transmit control signals from the switches. The switches and the lights may be attached to the circuit board and extend through the panel. Such measures make for simple production and assembly of the keyboard. All the electrical components are located, like the switches, on the electronic circuit board and may be manufactured separately. The distance pieces may have grooves therein for locating the second circuit board so that on assembly the switches or keyboard and the lights (LED's) are securely fixed in place. The advantage of this arrangement resides in that the electrical and the mechanical components may be produced separately and then only have to be assembled together. This makes economic production possible.

The further possible advantageous feature of the invention that edge connectors are used for coupling the two circuit boards makes for a reliable and simple electrical connection between the two boards. This connection is best made via a type of edge contact, which permits a simple connection and disconnection of the two boards. In the event of there being a defect, or for the use of a board with different wiring, simple replacement will be possible. Simultaneously the connection between the edge connectors performs a holding function in respect of the electronic circuit board so that a separate holding means in the form of fastening elements such as screws for example is superfluous.

The switches may be electrically connected via the circuit board, the female contacts and the contact plug with the components and the distribution manifold, the mount and the holding plate may be in the configuration of a letter H. Such features make the best possible use of the available space.

The mount and the manifold may be made of resin so that production by molding or casting will be possible, as for example by die casting, this involving particularly economic manufacture. Furthermore, there is a very substantial saving in weight so that it is even possible for a number of controllers to be connected together and simply transported.

The construction of the invention will be described in more detail in the accompanying drawings.

LIST OF THE SEVERAL FIGURES OF THE DRAWINGS

ACCOUNT OF WORKING EXAMPLE OF INVENTION

Figure 1:
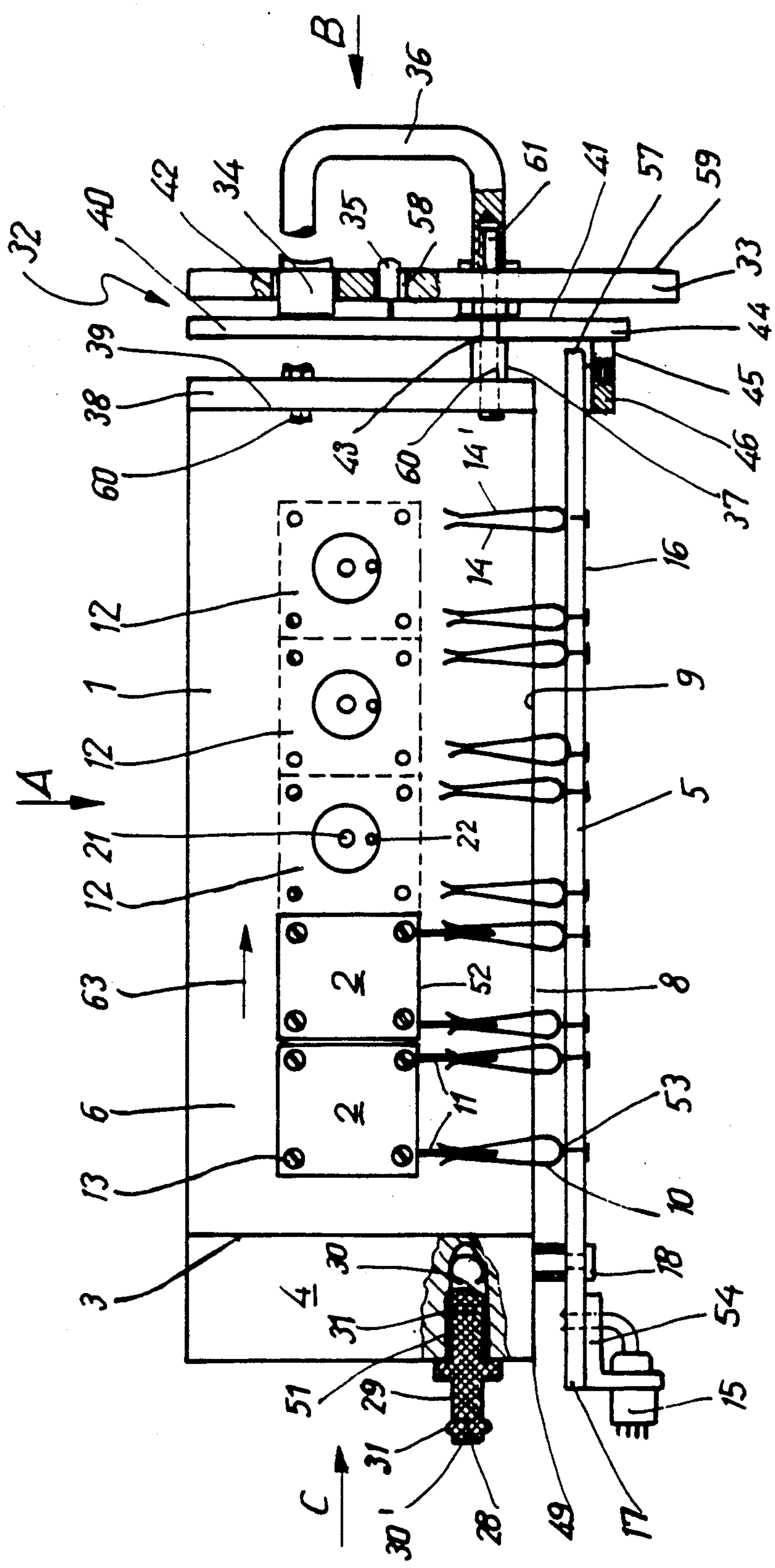
FIG. 1 is a plan view of the circuit assembly of the present invention.
Figure 2:
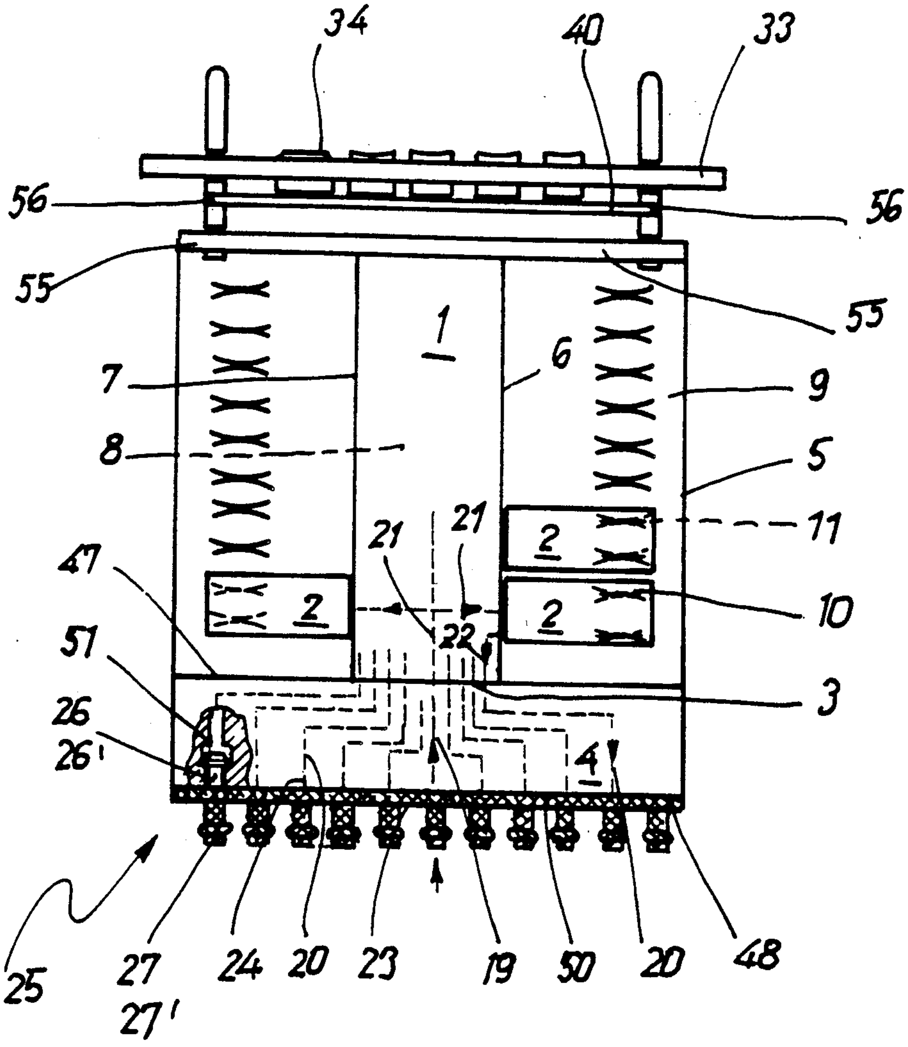
FIG. 2 is a side elevation of the circuit assembly of the invention looking in the direction A in FIG. 1 on a smaller scale.

Referring firstly to FIGS. 1 and 2 it will be seen that the circuit assembly in accordance with the invention comprises as its main parts a block-shaped component mount 1 in the form of a parallelepiped, an elongated manifold 4, an electronic circuit board 5, a front panel 33 and fluid power components 2, as for example solenoid valves.

The component mount 1 is in the form of a parallelepiped with a lower face 8 and on opposite side faces 6 and 7 respectively comprises a longitudinally aligned row of face zones 12 or seats for the mounting of components and which are in fact each fitted with a fluid power component 2.

On one of the end faces 3 of the component mount 1 the elongated manifold 4 is placed. In the central part of one of its surfaces 47, manifold 4 is connected with the end face 3 so that the arrangement of the manifold 4 with the component mount 1 has the form of a letter T. The manifold 4 internally has a number of connecting ducts which open on the end side or outer elongated face 48 directed away from the mount 1 and opposite to the surface or inner elongated face 47. The connecting ducts comprise at least a feed duct 19 for the admission of a fluid under pressure and a number of load ducts 20 for the supply of the fluid under pressure to loads. The ducts 19 and 20 furthermore have their other ends opening on the surface 47 at the end face 3 of the component mount 1 and merge directly into it.

The component mount 1 also has internal connecting ducts so that the feed duct 19 merges at the transition face between the surface 47 and the end face 3 with a feed duct 21 of the component mount 1 and the load ducts 20 in the same transition face merge with the load connecting ducts 22 of the component mount 1. The ducts 21 and 22 are so arranged in the component mount 1 that the feed connecting duct 21 opens at each of the seats 12 to be fitted with components and in addition one respective load connecting duct 22 opens into the seats 12 for the mounting of components. The individual seats 12 for the mounting of components are therefore connected with independent load connecting ducts 22 and a common feed connecting duct 21.

The outlet ports of the ducts 19 and 20 on the end face 48 of the manifold 4 (feed duct outlet port 23, and load duct outlet port 24) are best aligned with each other and respectively are at an equal distance from a corner edge 49 of the elongated manifold 4. A sealing bar 25 is flange mounted at the outlet ports 23 and 24 and with the help of such bar 25 it is possible for a further component (not shown) or lines or the like to be mounted on the manifold 4 without there being any lead at the connection with the ducts 19 and 20. The sealing bar 25 is made of rubber-like material and has a sealing band 50, which is fitted with two opposite rows 26' and 27' of connectors 26 and 27. The connectors 26 and 27 are respectively placed opposite each other in pairs and such pairs each have a common middle hole 28 extending in the axial direction. The number of connectors in each row thereof 26' and 27' is equal to the number of outlet ports 23 and 24 of the connecting ducts in the elongated manifold 4. At the outlet ports 23 and 24 the ducts 19 and 20 are widened out at least along the length of the connectors, the diameter of the widened part being approximately equal to the outer diameter of the connectors. The separate connectors 26 of the row 26' of connectors are pressed so far into the widened parts 51 that the sealing band 50 makes flat contact with the end face 48. At their outer faces 29 the connectors 26 and 27 each have a sealing bead 31 molded thereon near their free ends 30 and 30', and such bead extends past the outer face of the connectors by a small amount. At the engagement face of the sealing bead 31 with the widened parts 51 of the ducts 19*a* and 20 there is therefore the advantage of an optimum sealing action. The entire sealing bar is made of rubber-like material, as for example plastic material so that it may be fitted into the widened parts 51 and removed therefrom an indefinite number of times.

The precise arrangement of the feed connecting duct 21, of the load connecting ducts 22, of the feed duct 19 and of the load ducts 20 is only shown roughly in the figures and not shown in detail. In principle the form and arrangement of the ducts are however such that for each seat 12 on which a component is to be mounted there is a respective separate duct system 22 and 20 opening at an outlet port 24, while on the other hand, starting from the outlet port 23 each of the seats 12 for the mounting of the component 10 is supplied with a fluid under pressure from the common duct system 19 and 21.

Each of the seats 12 to be fitted with a component does in fact have such a component thereon as for example a valve, by which the supply of a fluid under pressure to the loads joined with the connectors 27 may be controlled. The components are detachably held in place by fastening elements such as screws 13 on the seats 12.

Parallel to one of the side faces 8, not fitted with components, of the component mount 1 the electronic circuit board 5 is placed, it being so aligned that the surface thereof is normal to the side faces 6 and 7 that are fitted with components. The plane of the electronic circuit board 5 is therefore parallel to the plane of the above described letter T formed by the manifold 4 and the component mount 1. Each of the components 2 has at least one contact plug 11 on its side face 52 turned towards the electronic circuit board and this contact plug 11 fits into a corresponding female contact 10, that is placed on the surface 9 of the electronic circuit board 5. The female contacts 10 are fixed onto the electronic circuit board by soldering for example. They are made of a resilient material, as for instance spring steel, and have two oppositely gripping lips 14 and 14' that are directed towards the components 2 and have the contact plugs 11 inserted into them. The separate female contacts are secured to the electronic circuit board by way of their attachment point 53 and are connected with a so-called multipole plug 15 (not shown) on the electronic circuit board. Each of the components 2 is therefore connected with the plug contact in the multipole plug 15 by way of a contact plug 11, a female contact 10 and the electronic circuit board. The multipole plug 15 is placed on the electronic circuit board 5 at its end face 17 facing in the direction of the manifold 4 and therefore faces in the same direction as the sealing bar 25. The attachment of the multipole plug 15 to the electronic circuit board 5 is by way of an intermediately placed holder 54 as for example an angle piece.

On the front side 39, opposite to the end face 3, of the mount 1 a holding plate 38 is detachably secured in position, as for example by screws that are not shown in detail, the plane of the holding plate 38 being normal to the longitudinal direction of the component mount 1 and parallel to the plane of the manifold 4. The manifold 4, the component mount 1 and the holding plate 38 therefore form an arrangement like a double letter T or the letter I. The front panel 33 is placed plane-parallel to the holding plate 38 and is secured in position by distance pieces 37 placed between the holding plate 38 and the front panel 33. The distance or spacer pieces 37 are fixed in pairs at the sides 55 of the holding plate 38 (see FIG. 2). Each spacer 37 has a peripheral groove 43 near its middle. A circuit board 40 is mounted between the holding plate 38 and the front panel 33. The circuit board 40 is plane parallel to and spaced from the holding plate 38 and the front panel 33. It is fixed in position since its limiting or side edges 56 directed in the direction of the sides 55 if plate 38, 55 are snapped into the peripheral grooves 43 of the spacer pieces 37. A printed circuit is present on the electronic circuit board which is electrically connected with the electronic circuit board 5. The electrical connection is made since at the end face 57, opposite the end face 17, of the electronic circuit board 5 there is an edge connector 46, into which the plug contacts 45 are inserted, which are fixed on the circuit board 40 at its end 44 directed towards the electronic circuit board 5 and are connected with the printed circuit on the circuit board electrically.

On the electronic circuit board surface 41 directed away from the block-shaped mount 1 there are switches 34 and light producing elements 35 as for example LED's, that project proud of the circuit board. The number of the switches and of light producing elements is in accordance with the number of faces 12 to be fitted with components. In accordance with the arrangement of the switches 34 and of the light producing elements 35 on the circuit board 40 the front panel 33 has recesses 42 and 58, whose sizes are generally equal to those of the switches 34 and of the light producing elements 35. The arrangement of the circuit board 40 in relation to the front panel 33 is such that the switches 34 fit through the recesses 42 and the light producing elements 35 through the recesses 58 and project past the surface 59, turned away from the block-shaped mount 1, of the front panel 33 a small amount (see also FIG. 3).

The holding plate 38, the spacer pieces 37 and the front panel 33 are secured together by a fastening element such as screws for instance, and in this connection the holding plate 38 and the front panel 33 are provided with suitable holes (not shown) and the spacer pieces 37 have a coaxial through hole, whose diameter is at least equal to the diameter of the fastening element 60. In accordance with the arrangement already explained of the distance or spacer pieces 37 at the sides 55 of the holding plate 38 the fastening elements 60 are also arranged in a pairs and their length is such that they project past the surface 59 and are screwed into a holding handle 36 here. The holding plate 38, the circuit board 40 and the front panel 33 therefore together form the front part 32, which is held together by the fastening elements 60 and the holding handle 36. The holding handle 36 is bent into the form of a letter U ahd has an internal thread 61 at each of its free ends so that the fastening elements 60 may be screwed thereinto.

To secure the electronic circuit board 5 in place on the manifold 4 the same is attached by means of fastening elements 18 as for instance screws. At the front part 32 the electronic circuit board 5 is secured in place between the edge connector 46 and the plug contacts 45 so that in this case it is possible to dispense with a separate holding means.

FIG. 4 once again serves to indicate that the circuit assembly is very well suited for use as a slide-in element in a rack or other enclosure designed therefor. The arrangement is very compact and not only the pneumatic by also the electrical connections are located at the end side 48. Furthermore both the sealing bar 25 and also the multipole plug 15 are designed in the form of so-called multipole connectors, in which the different separate connections are compactly arranged.

Figure 3:
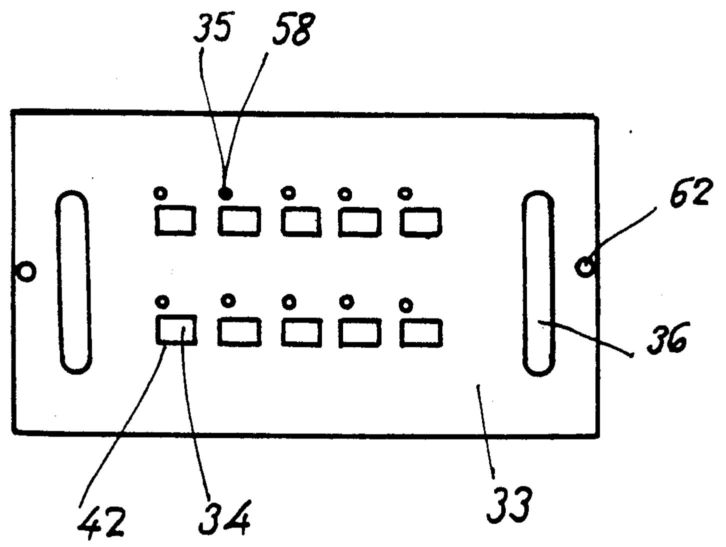
FIG. 3 is a front elevation of the circuit assembly of the present invention as seen looking in the direction of the arrow B in FIG. 1.
Figure 4:
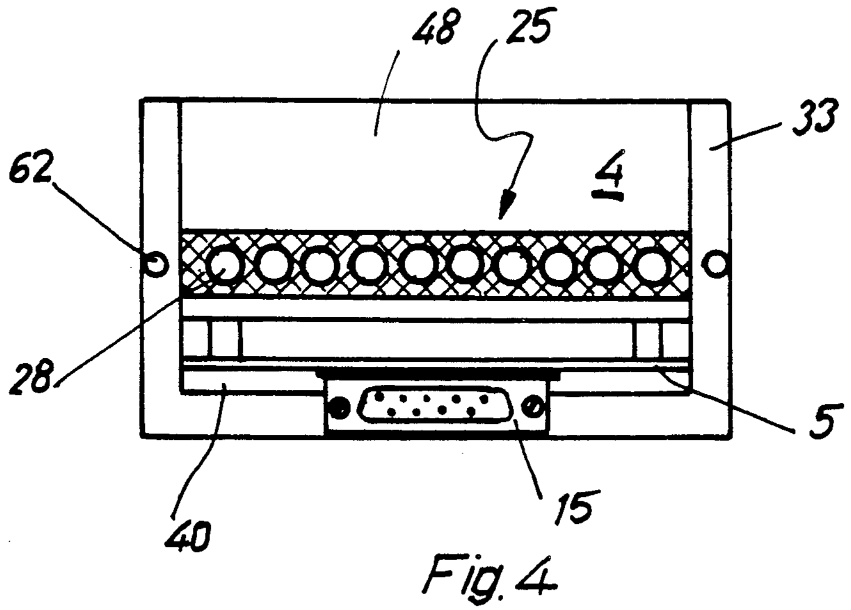
FIG. 4 is a rear view of the circuit assembly of the present invention looking in the direction of the arrow C of FIG. 1.

For holding the unit in a slide-in space the front panel 33 may be seen from FIGS. 3 and 4 to have openings 62 near the holding handles through which fastening elements as for example screws may be fitted for making a detachable connection between the circuit assembly and a slide-in space using the front panel 33.

For the sake of making the drawing straightforward in FIGS. 1 and 2 some of the faces 12 for the mounting of components are shown without same. It would naturally be possible for all the faces 12 to be fitted with components or only some of them in accordance with purpose of the circuit assembly.

The faces 12 for the mounting of components are placed on the mount 1 in accordance with FIG. 1 in aligned rows, the direction of such rows being indicated by the arrow 63. The aligned rows of the faces 12 for receiving the components, that is to say the components 2 as well if mounted on the faces 12, are placed so as to be parallel to the electronic circuit board.

We claim:

1. A circuit assembly comprising:
   - an elongated block-shaped manifold (4) made of synthetic resin and having an inner elongated face (47) and an outer elongated face (48), a pressure feed duct (19) extending through said manifold and having an opening opening into each of said inner and outer elongated faces and a plurality of load ducts (20) extending through said manifold and each having openings opening in said inner and outer elongated races, said openings of said pressure feed and load ducts opening in a central area of said inner elongated face, said openings of said pressure feed and load ducts lying in a row on said outer elongated face;
   - a row of fluid connectors connected respectively to said openings of said pressure feed and load ducts in said outer elongated face;
   - a block-shaped mount (1) having opposite end faces (3), a lower face (8), and opposite side faces (6, 7), one of said end faces being engaged against said central area of said inner elongated face of said manifold to form a T-shape with said manifold, said mount having a plurality of face zones (12) on each of said opposite side faces, said face zones each being provided for receiving a solenoid valve (2), said mount having a connecting duct (21) opening into each of said face zones (12), saud connecting duct opening into said one end face of said mount which is engaged with said manifold and communicating with said opening of said pressure feed duct of said manifold which is in said inner elongated face, said mount including a plurality of load connecting ducts (22) each opening in said one end face of said mount and each communicating with one opening of one load duct (20) of said manifold which is in said inner elongated face, each load connecting duct having an opening into one of said face zones;

a holding plate (38) connected to and engaged against the other end face of said mount opposite from said manifold, said manifold, mount and holding plate forming an I-shape lying in a plane parallel to said lower face (8) of said mount;

a plurality of solenoid valves, each solenoid valve being connected to one of said side faces and over one of said face zones (12), each solenoid valve having at least one electric contact plug (1) extending downwardly therefrom toward said lower face (8) of said mount, each solenoid valve being connected to one of said openings of said connecting ducts at said face zones (12) for selectively establishing communication between said pressure feed duct and said load ducts of said manifold;

a first circuit board (5) extending parallel to said lower face (8) of said mount and connected to said I-shape, a multi-pole plug (15) connected to said first circuit board, said multi-pole plug lying in a common plane with said fluid connectors, said first circuit board having a plurality of electric contacts (10) extending upwardly through said plane of said lower face, said contact plug (11) of each solenoid valve (2) being engaged with one of said contacts of said first circuit board;

a front panel (33) lying parallel to said holding plate (38), said front panel being fixed to and spaced from said holding plate and having a plurality of recesses (42) therethrough; and a second electric circuit board (40) connected between said holding plate (38) and said front panel (33), said second circuit board being electrically connected to said first circuit board and carrying a pluralty of luminated display and switch elements which extend through said recesses (42) of said front panel (33) and are accessible through said front panel.

2. The circuit assembly as claimed in claim 1 wherein the solenoid valve extend perpendicularly from opposite side faces (6, 7) of said mount in opposite directions.

3. A circuit assembly according to claim 2, wherein each of said solenoid valves is of a length so as to be concealed between said manifold (4) and said holding plate (38) and by said first circuit board (5).

4. The circuit assembly as claimed in claim 1 comprising fastening elements for securing said solenoid valve in place on said face zones on said mount.

5. The circuit assembly as claimed in claim 1 comprising at least one handle extending from said panel.

6. A circuit assembly according to claim 1, wherein each solenoid valve has a pair of said contact plugs, each contact plug forming a male plug extending toward said first circuit board.

7. A circuit assembly according to claim 6, wherein each pair of male plugs extend parallel to and are in alignment with said face zone on which solenoid valve carrying said pair of male plugs is engaged.

8. A circuit assembly according to claim 6, wherein each contact (10) of said first circuit board extends upwardly parallel to said side faces (6, 7) of said mount, said contacts lying in a pair of rows on opposite sides of said mount with one row of contacts on one side of said mount and the other row of contacts on the other side of said mount.

9. The circuit assembly as claimed in claim 8 wherein said contacts each comprise two gripping lips urged together by spring force to receive said male plug therebetween and hold them detachably in place.

10. A circuit assembly according to claim 1, wherein said multi-pole plug is connected to said first circuit board on a side thereof opposite from said manifold.

11. A circuit assembly according to claim 1, wherein said first circuit bord is detachably fastened to said manifold by means of at least one fastening element (18).

12. A circuit assembly according to claim 1, wherein said fluid connectors comprise a sealing strip (25) made of rubber-like material extending across said outer elongated face of said manifold (4) and having a plurality of connecting pieces (26, 27) arranged in coaxial pairs, one connecting piece extending into one of said pressure feed or load ducts (19, 20) and the other extending outwardly from said outer elongated face of said manifold with a common bore through each pair of connecting pieces.

13. A circuit assembly accoridng to claim 12, wherein each connecting piece has an annular sealing bead (31) therearound near a free end thereof.

14. A circuit assembly according to claim 1, including spacers (37) connected between said holding plate (38) and said front panel (33).

15. A circuit assembly according to claim 14, wherein each spacer (37) has a peripheral groove (43) into which said second circuit board (40) is held and positioned.

16. A circuit assembly according to claim 1, wherein said second circuit board (40) at an edge thereof adjacent said first circuit board includes a plurality of mating plugs (45) and said first circuit board (5) includes a plurality of edge connectors (46) engaged with said mating plugs (45).

17. A circuit assembly according to claim 16, wherein said first circuit board (5) is secured at its end adjacent said second circuit board, only by said engagement between said edge connectors and said mating plug.

18. A circuit assembly according to claim 1, wherein said blockshaped mount is made of synthetic resin.

* * * * *